United States Patent
Li

(10) Patent No.: US 12,402,299 B2
(45) Date of Patent: Aug. 26, 2025

(54) SEMICONDUCTOR MEMORY DEVICE WITH NANOWIRE STRUCTURE AND FORMING METHOD THEREOF

(71) Applicant: CHANGXIN MEMORY TECHNOLOGIES, INC., Hefei (CN)

(72) Inventor: Min Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 480 days.

(21) Appl. No.: 17/933,142

(22) Filed: Sep. 19, 2022

(65) Prior Publication Data

US 2024/0023310 A1    Jan. 18, 2024

(30) Foreign Application Priority Data

Jul. 13, 2022    (CN) .......................... 202210822495.0

(51) Int. Cl.
     *H10B 12/00*      (2023.01)
     *G11C 5/06*      (2006.01)

(52) U.S. Cl.
     CPC ........... *H10B 12/315* (2023.02); *G11C 5/063* (2013.01); *H10B 12/0335* (2023.02); *H10B 12/05* (2023.02); *H10B 12/482* (2023.02); *H10B 12/488* (2023.02)

(58) Field of Classification Search
     CPC .. H10B 12/315; H10B 12/0335; H10B 12/05; H10B 12/482; H10B 12/488; H10B 12/30; H10B 12/03; G11C 5/063; H10D 62/122; H10D 30/014; H10D 30/43; H10D 30/6728; H10D 30/6735; H10D 30/6757; H10D 62/121; H10D 62/119; H10D 62/151; H10D 62/235; B82Y 10/00
     USPC .......................................................... 257/296
See application file for complete search history.

(56) References Cited

U.S. PATENT DOCUMENTS

| | | | |
|---|---|---|---|
| 10,274,455 B2* | 4/2019 | Ram | G01N 27/4146 |
| 2011/0222356 A1* | 9/2011 | Banna | H10D 62/393 |
| | | | 257/E27.081 |
| 2014/0353591 A1* | 12/2014 | Kim | H01L 21/02164 |
| | | | 257/29 |
| 2016/0071970 A1* | 3/2016 | Hatcher | H10D 62/60 |
| | | | 257/192 |
| 2017/0236901 A1 | 8/2017 | Choi et al. | |

(Continued)

FOREIGN PATENT DOCUMENTS

| | | | | |
|---|---|---|---|---|
| CN | 111435641 A | * | 7/2020 | ............. B82Y 10/00 |
| TW | 200805509 A | * | 1/2008 | ............. B82Y 10/00 |
| WO | WO-2011162725 A1 | * | 12/2011 | ............. B82Y 10/00 |

*Primary Examiner* — Mohammad M Hoque

(74) *Attorney, Agent, or Firm* — Kilpatrick Townsend & Stockton LLP

(57) ABSTRACT

Disclosed are a semiconductor memory device and a forming method thereof. The semiconductor memory device includes: a substrate; a nanowire structure suspended above the substrate, where the nanowire structure includes a channel region, as well as a source region and a drain region that are located at two ends of the channel region respectively, a size of the drain region is smaller than a size of the source region, and the source region, the drain region, and the channel region are of a same doping type; a word line structure surrounding the channel region; and a bit line connected to the drain region, and a capacitor structure connected to the source region.

12 Claims, 6 Drawing Sheets

(56) References Cited

U.S. PATENT DOCUMENTS

2019/0043970 A1\* 2/2019 Colinge ............... H10D 30/63
2021/0335789 A1\* 10/2021 Zhu .................... H10D 30/6728
2022/0208766 A1\* 6/2022 Kim .................... H10B 12/488

\* cited by examiner

SEMICONDUCTOR MEMORY DEVICE WITH NANOWIRE STRUCTURE AND FORMING METHOD THEREOF

CROSS-REFERENCE TO RELATED APPLICATION

This application claims the priority of Chinese Patent Application No. 202210822495.0, submitted to the Chinese Intellectual Property Office on Jul. 13, 2022, the disclosure of which is incorporated herein in its entirety by reference.

TECHNICAL FIELD

The present disclosure relates to the field of memories, and in particular, to a semiconductor memory device and a forming method thereof.

BACKGROUND

As a commonly used semiconductor memory in computers, a dynamic random access memory (DRAM) is composed of many repeated memory cells. Each memory cell typically includes a capacitor and a transistor. In the transistor, the gate is connected to a word line, the drain is connected to a bit line, and the source is connected to the capacitor. A voltage signal on the word line controls the transistor to turn on or off, and then data information stored in the capacitor is read through the bit line, or data information is written into the capacitor through the bit line for storage.

Transistors in the existing DRAM still suffer from a leakage current in the off state.

SUMMARY

Some embodiments of the present disclosure provide a semiconductor memory device, including:
a substrate;
a nanowire structure, suspended above the substrate, where the nanowire structure includes a channel region, as well as a source region and a drain region that are located at two ends of the channel region respectively, a size of the drain region is smaller than a size of the source region, and the source region, the drain region, and the channel region are of a same doping type;
a word line structure, surrounding the channel region; and
a bit line, connected to the drain region, and a capacitor structure, connected to the source region.

Other embodiments of the present disclosure provide a method of forming a semiconductor memory device, including:
providing a substrate;
forming a nanowire structure on the substrate, where the nanowire structure is suspended above the substrate, the nanowire structure includes a channel region, as well as a source region and a drain region that are located at two ends of the channel region respectively, a size of the drain region is smaller than a size of the source region, and the source region, the drain region, and the channel region are of a same doping type;
forming a word line structure surrounding the channel region of the nanowire structure; and
preparing a bit line and a capacitor structure, wherein the drain region is connected to the bit line, and the source region is connected to the capacitor structure.

DETAILED DESCRIPTION

As is mentioned in the background, transistors in the existing DRAM still suffer from a leakage current in the off state.

It has been found that transistors in existing DRAM devices are generally gate-all-around junctionless field-effect transistors. A gate-all-around junctionless field-effect transistor generally includes: a columnar nanowire including a channel region as well as a source region and a drain region that are at two ends of the channel region respectively, where the channel region, the source region and the drain region are of a same doping type, e.g., N-type or P-type; and a gate structure surrounding the channel region. During operation of a gate-all-around junctionless field-effect transistor, most carriers in the channel reach the drain from the source in the cylindrical channel instead of the surface. By controlling a gate bias voltage to accumulate or deplete most of the carriers in the device channel, the channel conductivity can be modulated and thus the channel current can be controlled. When the gate bias voltage is large enough to completely deplete the carriers at a cross section of the cylindrical channel near the drain, the channel resistance becomes quasi-infinite and the device is in an off state. Since the junctionless field-effect transistor is a majority carrier device, high-concentration doping needs to be performed on the columnar nanowire to increase an on-state current. However, the sizes of drain region, channel region and source region are the same in columnar nanowire with a high doping concentration, which results in the overlap between the valence and conduction bands in the channel and drain of the columnar nanowire with the high doping concentration. The overlap causes electron tunneling from the valence band of the channel to the conduction band of the drain region, resulting in inter-band tunneling, which leads to a significant leakage current in the off state.

Therefore, the present disclosure provides a semiconductor memory device and a forming method thereof, which can avoid the leakage current in the off state.

To make the above objectives, features and advantages of the present disclosure clearer, specific implementations of the present disclosure will be described below in detail with reference to the accompanying drawings. In detailed descriptions on the embodiments of the present disclosure, schematic diagrams are not partially enlarged according to a general proportion for ease of descriptions. The schematic diagrams merely serve as examples, rather than limitations to the scope of protection of the present disclosure. In addition, sizes in a three-dimensional (3D) space including a length, width and depth should be provided in actual manufacture.

Figure 1:
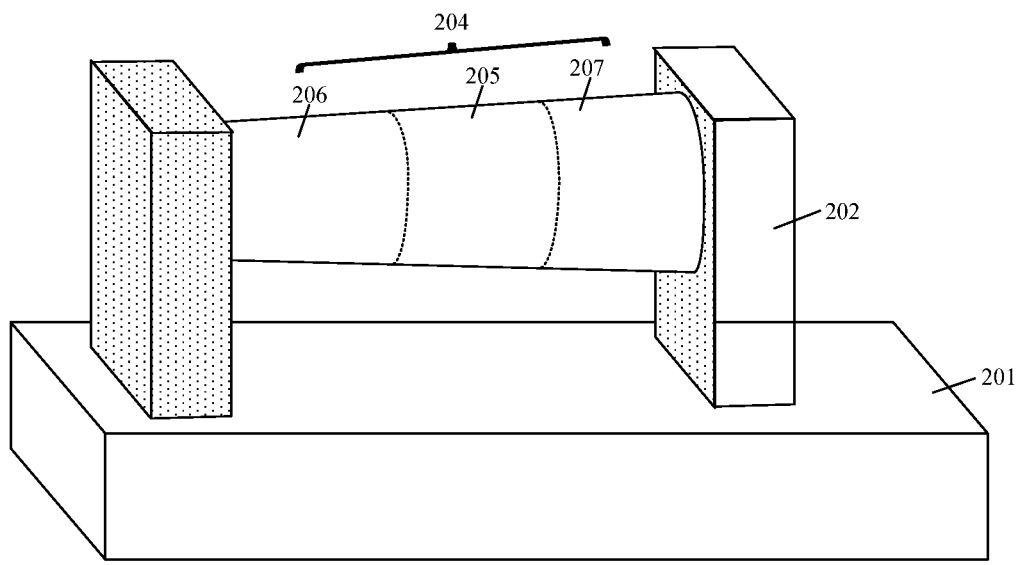
FIG. 1 to FIG. 8 are schematic structural diagrams of a process of forming a semiconductor memory device according to some embodiments of the present disclosure.
Figure 2:
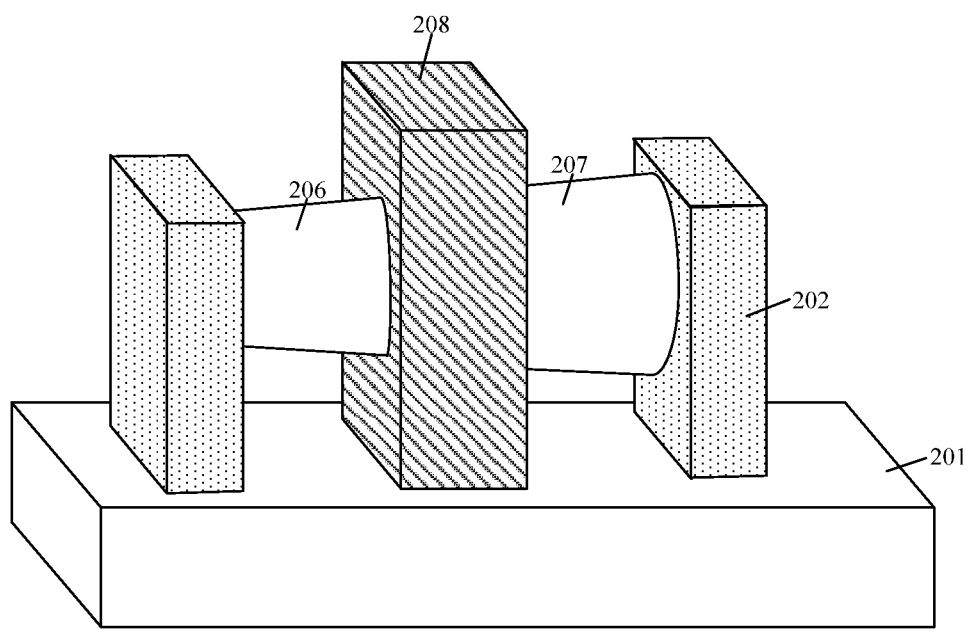

With reference to FIG. 1 and FIG. 2, some embodiments of the present disclosure first provide a semiconductor memory device, including:
a substrate 201;
a nanowire structure 204 suspended above the substrate 201, where the nanowire structure 204 includes a channel region 205, as well as a source region 207 and a drain region 206 that are located at two ends of the channel region 205 respectively (referring to FIG. 1), a size of the drain region 206 is smaller than a size of the source region 207, and the source region 207, the drain region 206, and the channel region 205 are of a same doping type;

a word line structure 208 (referring to FIG. 2) surrounding the channel region; and a bit line (not shown in the figure) connected to the drain region 206, and a capacitor structure (not shown in the figure) connected to the source region 207.

Specifically, the substrate 201 may be made of monocrystalline silicon (Si), monocrystalline germanium (Ge), silicon-germanium (GeSi) or silicon carbide (SiC); or may also be made of silicon on insulator (SOI) or germanium on insulator (GOI); or may further be made of another material such as gallium arsenide or other III-V compounds.

A material of the nanowire structure 204 is Si or SiGe. The nanowire structure 204 includes a channel region 205 as well as a source region 207 and a drain region 206 that are located at two ends of the channel region 205 respectively. The source region 207, the drain region 206, and the channel region 205 are of the same doping type. The word line structure 208 surrounds the channel region. Therefore, the transistor in the semiconductor memory device of the present disclosure is a gate-all-around junctionless field-effect transistor. Moreover, since the size of the drain region 206 is smaller than the size of the source region 207, when the junctionless field-effect transistor with the particular structure of the present disclosure is in an off-state, a leakage current from the channel region 205 to the drain region 206 is reduced.

Impurity ions doped in the source region 207, the drain region 206, and the channel region 205 are N-type impurity ions or P-type impurity ions. In some embodiments, the P-type impurity ions are one or more from the group consisting of boron, gallium and indium ions, and the N-type impurity ions are one or more from the group consisting of phosphorus, arsenic and antimony ions.

The size of the drain region 206 being smaller than the size of the source region 207 means that an average size of the drain region 206 is smaller than an average size of the drain region, or a size at a maximum cross section of the drain region 206 is smaller than a size at a minimum cross section of the source region 207.

In an embodiment, the size of the drain region 206 is smaller than the size of the channel region 205, and the size of the channel region 205 is smaller than the size of the source region 207.

In some embodiments, a size of the nanowire structure 204 gradually increases from the drain region 206 to the source region 207 linearly, curvilinearly, or stepwise. Specifically, in the direction from the drain region 206 to the source region 207, the size of the drain region 206 gradually increases linearly, curvilinearly, or stepwise from one end to the end connected to the channel region 205; the size of the channel region 205 gradually increases linearly, curvilinearly, or stepwise from the end connected to the drain region 206 to the end connected to the source region 207; the size of the source region 207 gradually increases linearly, curvilinearly, or stepwise from the end connected to the channel region 205 to the tail end.

In some embodiments, the channel region 205, the source region 207, and the drain region 206 of the nanowire structure 204 are in cylindrical shape.

In some embodiments, the nanowire structure 204 is horn-shaped. The size of the source region 207 is a diameter of the source region 207, the size of the drain region 206 is a diameter of the drain region 206, and a difference between the diameter of the source region 207 and the diameter of the drain region 206 is at least greater than 10 nm, such that when the junctionless field-effect transistor of the particular shape and size is in the off-state, the leakage current from the channel region 205 to the drain region 206 is further reduced.

In a specific embodiment, the diameter of the drain region 206 is 4 nm to 20 nm, and the diameter of the source region 207 is 15 nm to 50 nm.

The word line structure 208 includes a gate dielectric layer that is located on a surface of the channel region 205 and surrounds the channel region 205, and a metal word line that is located on a surface of the gate dielectric layer and surrounds the channel region 205. In some embodiments, the gate dielectric layer is made of silicon oxide, and the metal word line may be made of one or more from the group consisting of Al, Cu, Ag, Au, Pt, Ni, Ti, TiN, TaN, Ta, TaC, TaSiN, W, WN, and Wsi.

In this embodiment, the nanowire structure 204 is horizontally suspended above the substrate 201. Both ends of the nanowire structure 204 are supported by sacrificial layers 202 on a surface of the substrate 201 such that the nanowire structure 204 is horizontally suspended above the substrate 201. The capacitor structure is connected to the source region 207 of the horizontally suspended nanowire structure 204.

A material of the sacrificial layer 202 is different from that of the nanowire structure 204. In some embodiments, the material of the sacrificial layer 202 is one of silicon oxide, silicon nitride, silicon oxynitride, silicon carbonitride, amorphous silicon, amorphous carbon, polycrystalline silicon, or germanium-silicon.

In this embodiment, one layer of nanowire structures 204 are provided, and a plurality of nanowire structures 204 may be arranged in parallel in one layer. In other embodiments, multiple layers (more than 2 layers) of nanowire structures 204 may be provided. Each layer includes a plurality of nanowire structures 204 arranged in parallel, and the nanowire structures in each layer is supported by one sacrificial layer. Specifically, referring to FIG. 4 and FIG. 5, three layers of nanowire structures 204 are provided. Accordingly, three support layers 202 are provided, and each support layer supports one layer of nanowire structures 204 correspondingly. A plurality of word line structures 208 may be provided. Each of the word line structures 208 surrounds the channel regions of a plurality of nanowire structures 204 arranged in a vertical direction. Correspondingly, a plurality of bit lines may be provided. The plurality of bit lines may be arranged horizontally, and each bit line connect the drain regions of the plurality of nanowire structures 204 in one layer. In other embodiments, the word line structures are horizontally arranged. Each of the word line structures surrounds the channel regions of the plurality of nanowire structures 204 in one layer. Correspondingly, the bit lines are vertically arranged, and each bit line connects the drain regions of the plurality of nanowire structures 204 arranged in the vertical direction.

Figure 11:
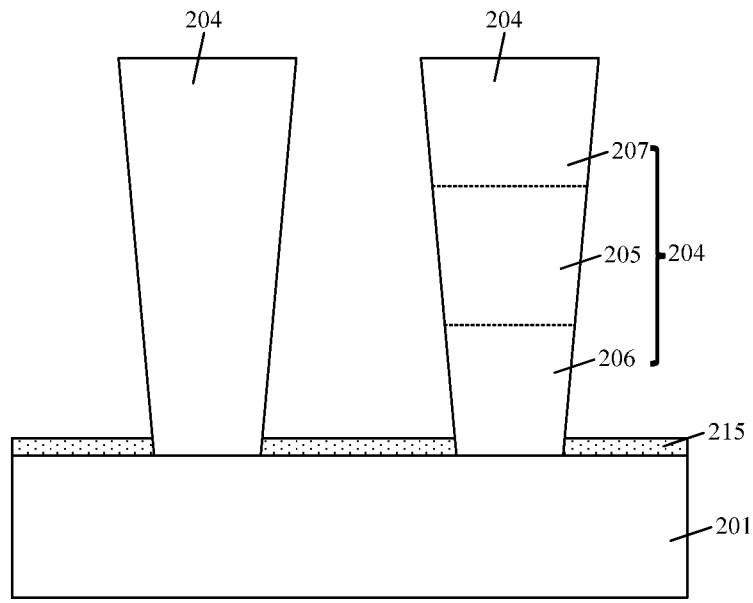
Figure 12:
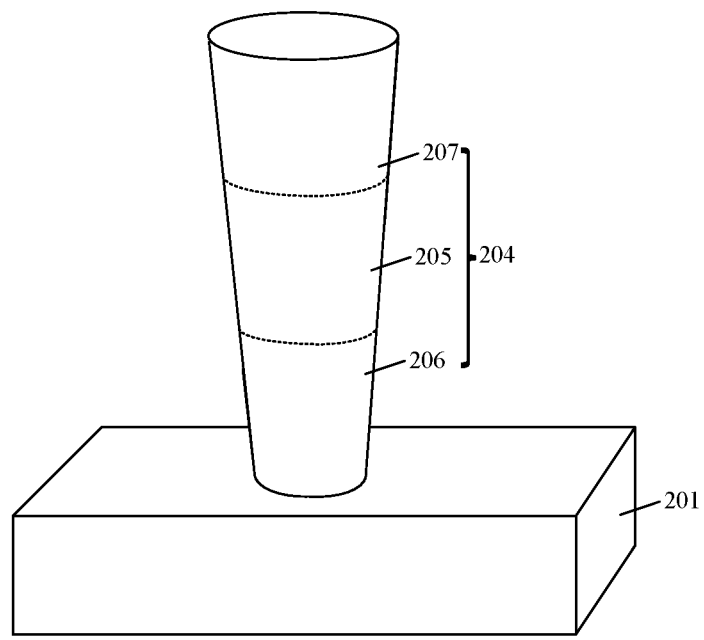

In other embodiments, referring to FIG. 11 and FIG. 12, FIG. 12 is a schematic three-dimensional structure diagram of one of the nanowire structures in FIG. 11. The nanowire structure 204 is vertically suspended above the substrate 201. The source region 207 is located at an upper end of the nanowire structure 204, the drain region 206 is located at a lower end of the nanowire structure 204, and the channel region 205 is located in the middle of the nanowire structure 204. The drain region 206 is in contact with the substrate 201 and supports the nanowire structure 204, such that the nanowire structure 204 is vertically suspended above the substrate 201.

Figure 13:
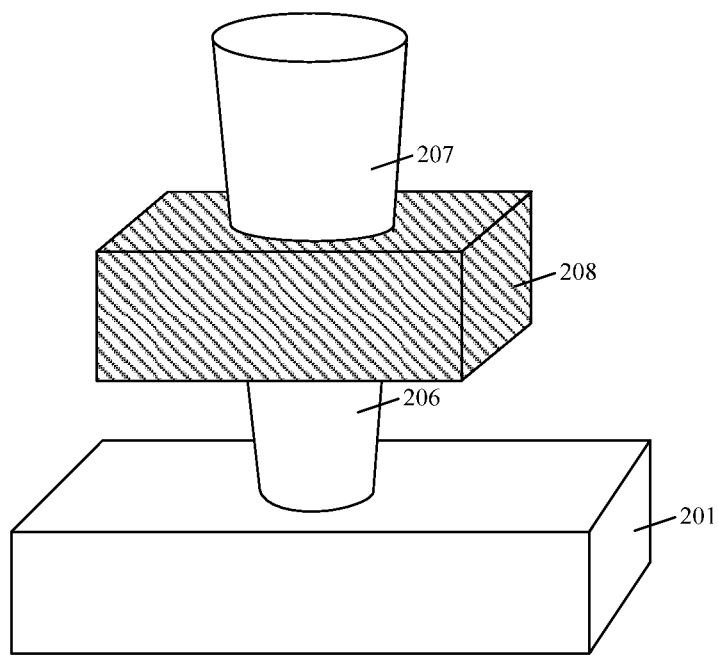

Referring to FIG. 13, the word line structure 208 surrounds the channel region 205 of the vertical nanowire structure 204 (referring to FIG. 12). An isolation dielectric layer (not shown in the figure) may be provided between the word line structure 208 and the substrate 201.

One or more vertical nanowire structures 204 may be provided on the substrate 201. In some embodiments, when a plurality of nanowire structures 204 are provided on the substrate, adjacent nanowire structures 204 are isolated by the isolation dielectric layer.

Figure 14:
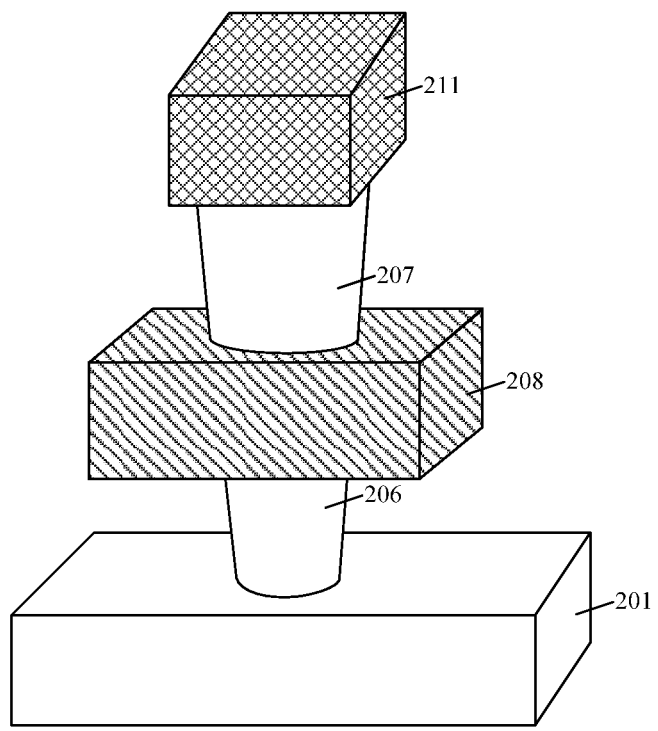

Referring to FIG. 14, the capacitor structure 211 is connected to the source region 207 of the vertically suspended nanowire structure 204.

Figure 3:
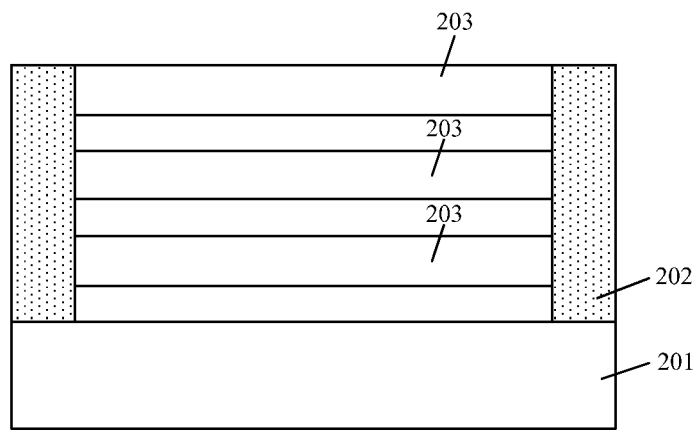
Figure 4:
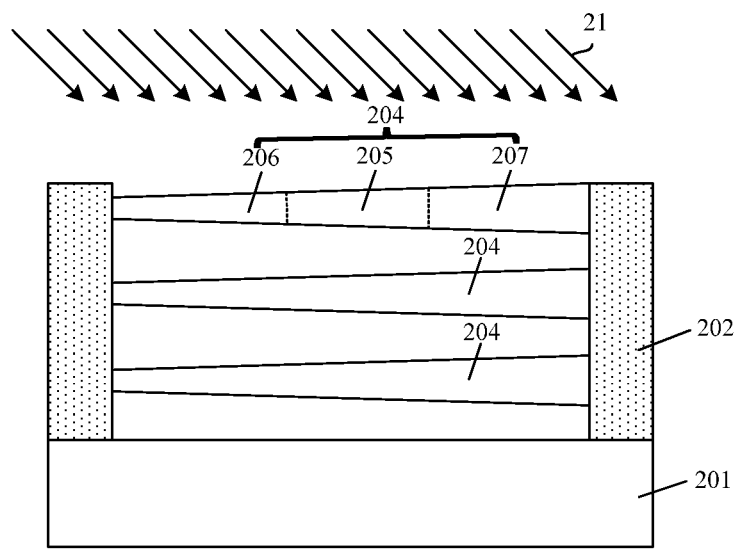

Other embodiments of the present disclosure further provide a method of forming a semiconductor memory device. A specific process is as follows:

With reference to FIG. 3 and FIG. 4, a substrate 201 is provided; and a nanowire structure 204 is formed on the substrate 201, where the nanowire structure 204 is suspended above the substrate 201, the nanowire structure 204 includes a channel region 205, as well as a source region 207 and a drain region 206 that are located at two ends of the channel region 205 respectively, a size of the drain region 206 is smaller than a size of the source region 207, and the source region 207, the drain region 206, and the channel region 205 are of a same doping type.

Both ends of the nanowire structure 204 are supported by sacrificial layers 202 on a surface of the substrate 201 such that the nanowire structure 204 is horizontally suspended above the substrate 201, and at least one layer of nanowire structures 204 are provided. In a specifically embodiment, one or more layers of nanowire structures 204 are provided.

In an embodiment, a process of forming the nanowire structure 204 includes: forming, on the substrate, a laminated structure including sacrificial layers and semiconductor layers that are alternately laminated; forming a plurality of parallel trenches penetrating the laminated structure, where the remaining semiconductor layers between adjacent ones of the trenches form a plurality of layers of initial nanowire structures 203; partially removing each of the sacrificial layers between adjacent ones of the plurality of layers of initial nanowire structures 203, where the remaining sacrificial layers 202 allow the initial nanowire structures 203 to be suspended (referring to FIG. 3); and performing an etching process on each of the initial nanowire structures 203 (referring to FIG. 3), and forming the nanowire structures 204 (referring to FIG. 4), where each of the nanowire structures 204 includes the channel region 205, as well as the source region 207 and the drain region 206 that are located at two ends of the channel region 205 respectively, the size of the drain region 206 is smaller than the size of the source region 207, and during the etching process, an etching gas 21 is inputted from above the substrate 201 in a direction at an acute angle with the substrate 201, such that the etching gas 21 flows from an end of the initial nanowire structure 203 at which the drain region is to be formed to an end of the initial nanowire structure 203 at which the source region is to be formed.

The source region 207, the drain region 206, and the channel region 205 are of the same doping type. Impurity ions doped in the source region 207, the drain region 206, and the channel region 205 are N-type impurity ions or P-type impurity ions. In this embodiment, when the semiconductor layer is formed, the semiconductor layer is doped with N-type impurity ions or P-type impurity ions, to reduce process steps.

During the etching process, the etching gas 21 is inputted from above the substrate 201 in a direction at an acute angle with the substrate 201, such that the etching gas 21 flows from an end of the initial nanowire structure 203 at which the drain region is to be formed to an end of the initial nanowire structure 203 at which the source region is to be formed. Therefore, the etching gas has a higher etching rate for the end of the initial nanowire structure 203 at which the drain region is to be formed, and a lower etching rate for the end of the initial nanowire structure 203 at which the source region is to be formed, such that the size of the drain region 206 is smaller than the size of the source region 207 in the nanowire structure 204.

In an embodiment, the etching gas used in the etching process is a hydrogen fluoride gas and an ammonia gas. The acute angle between the input direction of the etching gas 21 and the substrate 201 is 30-50°. A flow rate of the etching gas is 1 standard liter per minutes (slm) to 10 slm. A chamber temperature is 30-50° C. With the specific etching parameters, it is easier to make the size of the drain region 206 smaller than the size of the source region 207 in the formed nanowire structure 204, and the formed nanowire structure 204 has a uniform surface appearance.

In some embodiments, a process of forming the nanowire structure 204 includes: forming, on the substrate 201, a laminated structure including sacrificial layers and semiconductor layers that are alternately laminated, where a thickness of each of the semiconductor layers gradually increases from one end to the other end; forming a plurality of parallel trenches penetrating the laminated structure, where the remaining semiconductor layers between adjacent ones of the trenches form a plurality of layers of initial nanowire structures, and a thickness of each of the initial nanowire structures gradually increases from one end to the other end; partially removing each of the sacrificial layers between adjacent ones of the plurality of layers of initial nanowire structures, where the remaining sacrificial layers allow the initial nanowire structures to be suspended; performing annealing processing, such that a surface of each of the initial nanowire structures is rounded, and forming the nanowire structures 204, where each of the nanowire structures 204 includes the channel region 205, as well as the source region 207 and the drain region 206 that are located at two ends of the channel region 205 respectively, and the size of the drain region 206 is smaller than the size of the source region 207.

In some embodiments, during forming of the semiconductor layer, an etching process may be performed to allow the thickness of the semiconductor layer to gradually increase from one end to the other end.

In some embodiments, the formed nanowire structure 204 is horn-shaped. In some embodiments, the size of the source region 207 is a diameter of the source region, the size of the drain region 206 is a diameter of the drain region, and a difference between the diameter of the source region 207 and the diameter of the drain region 206 is at least greater than 10 nm. In some embodiments, the diameter of the drain region 206 is 4 nm to 20 nm, and the diameter of the source region 207 is 15 nm to 50 nm.

In some embodiments, the channel region 205, the source region 207, and the drain region 206 of the nanowire structure 204 are in cylindrical shape.

Figure 5:
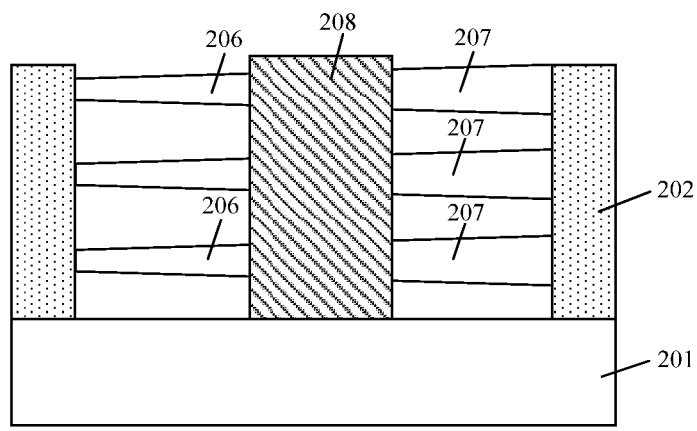

Referring to FIG. 5, a word line structure 208 surrounding the channel region of the nanowire structure is formed.

Figure 6:
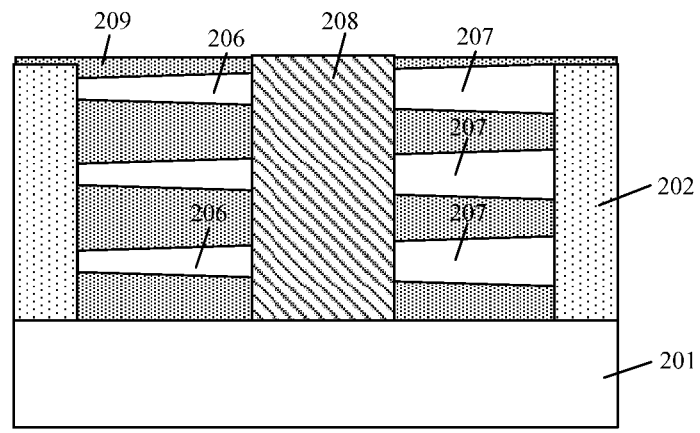

Referring to FIG. 6, an isolation dielectric layer 209 covering the word line structure 208 and partial nanowire structure is formed.

In an embodiment, after the isolation dielectric layer 209 is formed, the sacrificial layer is partially removed to expose the drain region of the nanowire structure, and a bit line connected to the drain region is formed.

Figure 7:
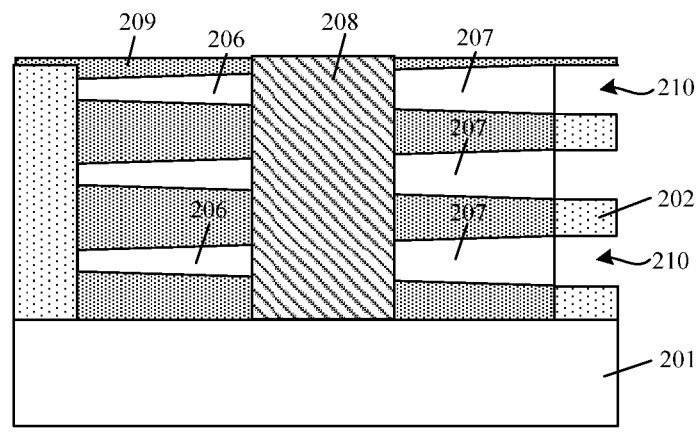
Figure 8:
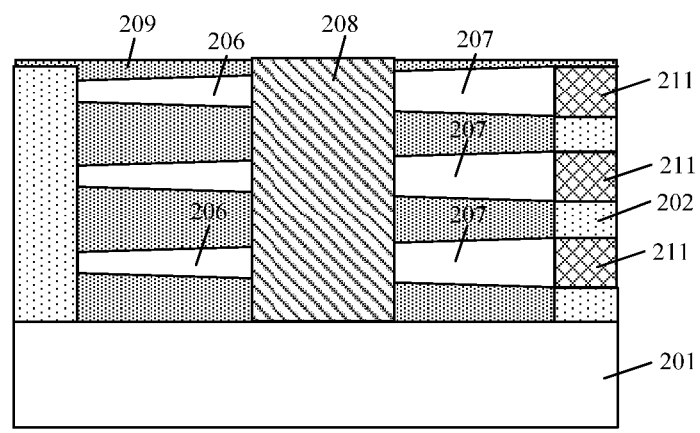

Referring to FIG. 7 and FIG. 8, the sacrificial layer is partially removed to form a capacitor structure 211 connected to the source region 207.

Figure 9:
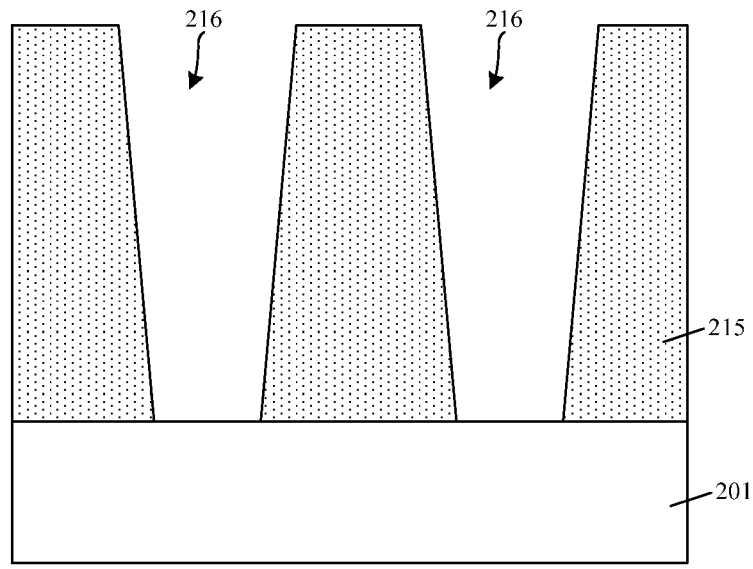
FIG. 9 to FIG. 14 are schematic structural diagrams of a process of forming a semiconductor memory device according to other embodiments of the present disclosure.

In the foregoing embodiment, when the nanowire structure 204 is formed, the formed nanowire structure 204 is horizontally suspended above the substrate 201. In other embodiments, when the nanowire structure is formed, the formed nanowire structure is vertically suspended above the substrate. A specific forming process includes: referring to FIG. 9, forming a sacrificial layer 215 on the substrate 201; and etching the sacrificial layer 215, to form at least one first through hole 216 in the sacrificial layer 215, where a size of a lower end of the first through hole 216 is smaller than a size of an upper end of the first through hole 216.

A material of the sacrificial layer 215 may be one of silicon oxide, silicon nitride, silicon oxynitride, silicon carbonitride, or amorphous carbon. In this embodiment, the material of the sacrificial layer 215 is silicon oxide.

The bottom of the formed first through hole 216 may expose partial surface of the substrate 201. A size at a lower end of the first through hole 216 is smaller than a size at an upper end of the first through hole 216. The nanowire structure is subsequently formed in the first through hole 216. The shape of the first through hole 216 defines the shape of the subsequently nanowire structure. In some embodiments, the size of the first through hole 216 gradually increases from top to bottom.

In some embodiments, the sacrificial layer 215 is etched by using a plasma etching process. By controlling parameters such as a gas flow rate and a bias voltage in the etching process, the size at the lower end of the first through hole 216 is smaller than the size at the upper end of the first through hole 216.

Figure 10:
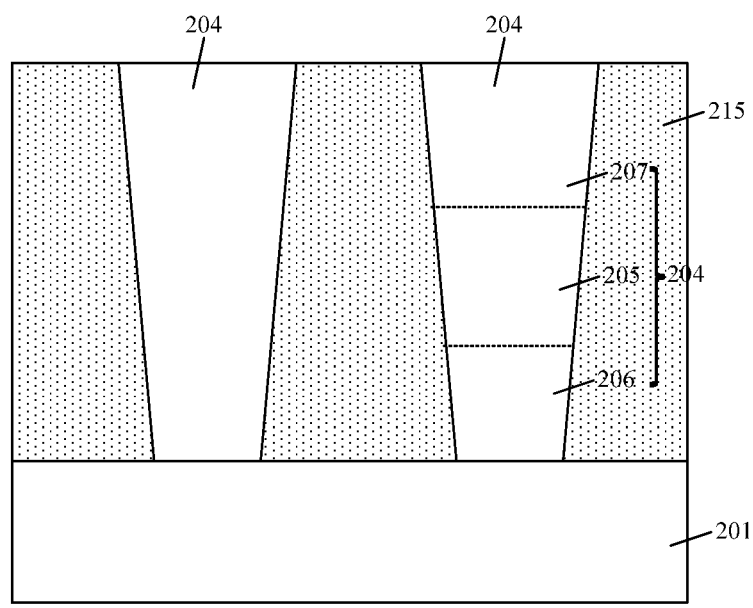

Referring to FIG. 10, the first through hole is filled up with a semiconductor material, to form the vertically suspended nanowire structure 204. The size at the lower end of the nanowire structure 204 is smaller than the size at the upper end of the nanowire structure.

The upper end of the nanowire structure 204 is used as the source region 207, and the lower end of the nanowire structure 204 is used as the drain region 206. The middle part of the nanowire structure 204 is used as the channel region 205. The size of the drain region 206 is smaller than the size of the source region 207.

The semiconductor material may be Si or GeSi. In an embodiment, the process of filling up the first through hole with the semiconductor material includes: forming a semiconductor material layer in the first through hole and on a surface of the sacrificial layer 215 through deposition or an epitaxy process, where the semiconductor material layer fills up the first through hole; and removing the semiconductor material layer higher than an upper surface of the sacrificial layer by using a chemical mechanical polishing process, to form the semiconductor material that fills up the first through hole.

Referring to FIG. 11 and FIG. 12, FIG. 12 is a schematic three-dimensional structure diagram of one of the nanowire structures in FIG. 11. The sacrificial layer is removed.

The sacrificial layer may be completely or partially removed. In some embodiments, when the sacrificial layer 215 is made of silicon oxide, the sacrificial layer 215 may be partially retained on the substrate 201 to serve as an isolation layer subsequently.

Referring to FIG. 13, a word line structure 208 surrounding the channel region of the vertically suspended nanowire structure 204 is formed.

Before the word line structure 208 is formed, a bit line (not shown in the figure) connected to the drain region of the suspended nanowire structure 204 is formed; and after the bit line is formed, a first isolation dielectric layer (not shown in the figure) is formed on the substrate 201, where a surface of the first isolation dielectric layer is flush with the bottom of the channel region.

Referring to FIG. 14, a capacitor structure 211 connected to the source region 207 of the vertically suspended nanowire structure is formed.

Before the capacitor structure 211 is formed, a second isolation dielectric layer (not shown in the figure) is formed word line structure 208, where an upper surface of the second isolation dielectric layer is flush with an upper surface of the source region 207; and the capacitor structure 211 connected to the source region 207 is formed on the second isolation dielectric layer.

It should be noted that the limitations or descriptions of the same or similar parts in the foregoing embodiments of the method of forming a semiconductor memory device and the foregoing embodiments of the semiconductor memory device are not repeated herein. For details, refer to the limitations or descriptions of the corresponding parts in the foregoing embodiments of the semiconductor memory device.

Although the present disclosure has been disclosed above with preferred embodiments, these preferred embodiments are not intended to limit the present disclosure. Those skilled in the art can make possible alterations and modifications on the technical solutions of the present disclosure with the methods and technical contents disclosed above without departing from the spirit and scope of the present disclosure. Therefore, any simple changes, equivalent alterations, and modifications made on the foregoing embodiments according to the technical essence of the present disclosure without departing from the contents of the technical solutions of the present disclosure shall fall within the protection scope of the technical solutions of the present disclosure.

The invention claimed is:

1. A semiconductor memory device, comprising:
   a substrate;
   a nanowire structure, suspended above the substrate, wherein the nanowire structure comprises a channel region, as well as a source region and a drain region that are located at two ends of the channel region respectively, a size of the drain region is smaller than a size of the source region, and the source region, the drain region, and the channel region are of a same doping type;
   a word line structure, surrounding the channel region; and
   a bit line, connected to the drain region, and a capacitor structure, connected to the source region;
   wherein the size of the drain region is smaller than a size of the channel region, and the size of the channel region is smaller than the size of the source region;
   wherein both ends of the nanowire structure are supported by sacrificial layers on a surface of the substrate such that the nanowire structure is horizontally suspended above the substrate, and at least one layer of nanowire structures is provided; and the capacitor structure is connected to the source region of the horizontally suspended nanowire structure.

2. The semiconductor memory device according to claim 1, wherein a size of the nanowire structure gradually increases from the drain region to the source region linearly, curvilinearly, or stepwise.

3. The semiconductor memory device according to claim 1, wherein the channel region, the source region, and the drain region of the nanowire structure are in cylindrical shape; and the nanowire structure is horn-shaped.

4. The semiconductor memory device according to claim 3, wherein the size of the source region is a diameter of the source region, the size of the drain region is a diameter of the drain region, and the diameter of the drain region is 4 nm to 20 nm, and the diameter of the source region is 15 nm to 50 nm.

5. The semiconductor memory device according to claim 1, wherein a material of the nanowire structure is Si or SiGe.

6. The semiconductor memory device according to claim 1, wherein the word line structure comprises a gate dielectric layer that is located on a surface of the channel region and surrounds the channel region, and a gate electrode that is located on a surface of the gate dielectric layer and surrounds the channel region.

7. A method of forming a semiconductor memory device, comprising:
providing a substrate;
forming a nanowire structure on the substrate, wherein the nanowire structure is suspended above the substrate, the nanowire structure comprises a channel region, as well as a source region and a drain region that are located at two ends of the channel region respectively, a size of the drain region is smaller than a size of the source region, and the source region, the drain region, and the channel region are of a same doping type;
wherein the size of the drain region is smaller than a size of the channel region, and the size of the channel region is smaller than the size of the source region
forming a word line structure surrounding the channel region of the nanowire structure; and
preparing a bit line and a capacitor structure, wherein the drain region is connected to the bit line, and the source region is connected to the capacitor structure;
wherein both ends of the nanowire structure are supported by sacrificial layers on a surface of the substrate such that the nanowire structure is horizontally suspended above the substrate, and at least one layer of nanowire structures are provided;
wherein a capacitor structure connected to the source region of the horizontally suspended nanowire structure is formed.

8. The method of forming a semiconductor memory device according to claim 7, wherein a process of forming the nanowire structure comprises: forming, on the substrate, a laminated structure comprising sacrificial layers and semiconductor layers that are alternately laminated; forming a plurality of parallel trenches penetrating the laminated structure, wherein remaining semiconductor layers between adjacent ones of the trenches form a plurality of layers of initial nanowire structures; partially removing each of the sacrificial layers between adjacent ones of the plurality of layers of initial nanowire structures, wherein remaining sacrificial layers allow the initial nanowire structures to be suspended; and performing an etching process on each of the initial nanowire structures, and forming the nanowire structures, wherein each of the nanowire structures comprises the channel region, as well as the source region and the drain region that are located at two ends of the channel region respectively, the size of the drain region is smaller than the size of the source region, and during the etching process, an etching gas is inputted from above the substrate in a direction at an acute angle with the substrate, such that the etching gas flows from an end of the initial nanowire structure at which the drain region is to be formed to an end of the initial nanowire structure at which the source region is to be formed.

9. The method of forming a semiconductor memory device according to claim 8, wherein the etching gas used in the etching process is a hydrogen fluoride gas and an ammonia gas, the acute angle between the input direction of the etching gas and the substrate is 30-50°, a flow rate of the etching gas is 1 slm to 10 slm, and a chamber temperature is 30-50° C.

10. The method of forming a semiconductor memory device according to claim 7, wherein a process of forming the nanowire structure comprises: forming, on the substrate, a laminated structure comprising sacrificial layers and semiconductor layers that are alternately laminated, wherein a thickness of each of the semiconductor layers gradually increases from one end to the other end; forming a plurality of parallel trenches penetrating the laminated structure, wherein remaining semiconductor layers between adjacent ones of the trenches form a plurality of layers of initial nanowire structures, and a thickness of each of the initial nanowire structures gradually increases from one end to the other end; partially removing each of the sacrificial layers between adjacent ones of the plurality of layers of initial nanowire structures, wherein remaining sacrificial layers allow the initial nanowire structures to be suspended; performing annealing processing, such that a surface of each of the initial nanowire structures is rounded, and forming the nanowire structures, wherein each of the nanowire structures comprises the channel region, as well as the source region and the drain region that are located at two ends of the channel region respectively, and the size of the drain region is smaller than the size of the source region.

11. The method of forming a semiconductor memory device according to claim 7, wherein the size of the source region is a diameter of the source region, the size of the drain region is a diameter of the drain region, and the diameter of the drain region is 4 nm to 20 nm, and the diameter of the source region is 15 nm to 50 nm.

12. The method of forming a semiconductor memory device according to claim 7, wherein the channel region, the source region, and the drain region of the nanowire structure are in cylindrical shape.

* * * * *